United States Patent
Fukukawa et al.

(10) Patent No.: US 10,351,673 B2
(45) Date of Patent: Jul. 16, 2019

(54) BLOCK POLYIMIDE, BLOCK POLYAMIDE ACID IMIDE AND USE THEREOF

(71) Applicant: MITSUI CHEMICALS, INC., Minato-ku, Tokyo (JP)

(72) Inventors: Kenichi Fukukawa, Tokyo (JP); Masaki Okazaki, Chiba (JP); Yoshihiro Sakata, Ichikawa (JP); Tatsuhiro Urakami, Ichihara (JP); Atsushi Okubo, Tokyo (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/589,114

(22) Filed: May 8, 2017

(65) Prior Publication Data

US 2017/0240705 A1 Aug. 24, 2017

Related U.S. Application Data

(62) Division of application No. 14/786,703, filed as application No. PCT/JP2014/002284 on Apr. 23, 2014, now abandoned.

(30) Foreign Application Priority Data

Apr. 25, 2013 (JP) .................................. 2013-092388

(51) Int. Cl.
| | | |
|---|---|---|
| *C08G 73/10* | (2006.01) | |
| *C08J 5/18* | (2006.01) | |
| *G03F 7/037* | (2006.01) | |
| *H01B 3/30* | (2006.01) | |
| *H05K 1/03* | (2006.01) | |
| *B32B 15/08* | (2006.01) | |
| *B32B 27/28* | (2006.01) | |
| *B32B 15/088* | (2006.01) | |
| *C08L 79/08* | (2006.01) | |
| *C09D 179/08* | (2006.01) | |
| *G03F 7/20* | (2006.01) | |
| *H05K 1/02* | (2006.01) | |
| *G03F 7/11* | (2006.01) | |
| *G03F 7/32* | (2006.01) | |
| *H05K 3/00* | (2006.01) | |
| *H05K 3/28* | (2006.01) | |

(52) U.S. Cl.
CPC .......... *C08G 73/1042* (2013.01); *B32B 15/08* (2013.01); *B32B 15/088* (2013.01); *B32B 27/281* (2013.01); *C08G 73/10* (2013.01); *C08G 73/1082* (2013.01); *C08J 5/18* (2013.01); *C08L 79/08* (2013.01); *C09D 179/08* (2013.01); *G03F 7/037* (2013.01); *G03F 7/11* (2013.01); *G03F 7/20* (2013.01); *G03F 7/322* (2013.01); *H01B 3/306* (2013.01); *H05K 1/0296* (2013.01); *H05K 1/0346* (2013.01); *H05K 1/0353* (2013.01); *H05K 1/0393* (2013.01); *H05K 3/0017* (2013.01); *B32B 2307/206* (2013.01); *B32B 2307/412* (2013.01); *B32B 2457/08* (2013.01); *B32B 2457/20* (2013.01); *B32B 2551/00* (2013.01); *C08J 2379/08* (2013.01); *H05K 3/281* (2013.01); *H05K 2201/0154* (2013.01)

(58) Field of Classification Search
CPC .... C07C 227/04; C08G 73/1042; C08L 79/08
See application file for complete search history.

(56) References Cited

U.S. PATENT DOCUMENTS

| | | | | |
|---|---|---|---|---|
| 5,773,559 A | * | 6/1998 | Miyamoto | ......... C08G 73/1042 427/359 |
| 9,339,992 B2 | * | 5/2016 | Fukukawa | .............. B32B 15/08 |
| 2010/0069520 A1 | | 3/2010 | Kim et al. | |
| 2012/0021234 A1 | | 1/2012 | Fukukawa et al. | |
| 2012/0097435 A1 | | 4/2012 | Goshima et al. | |
| 2013/0189622 A1 | | 7/2013 | Kim et al. | |

FOREIGN PATENT DOCUMENTS

| | | | |
|---|---|---|---|
| JP | 62-236732 A | 10/1987 | |
| JP | 9-176315 A | 7/1997 | |
| JP | 2002-161136 A | 6/2002 | |
| JP | 2002-167433 A | 6/2002 | |
| JP | 2006-70096 A | 3/2006 | |
| JP | 2007-169304 A | 7/2007 | |
| JP | 2007-231224 A | 9/2007 | |
| JP | 2008-81718 A | 4/2008 | |
| JP | 2008-168439 A | 7/2008 | |
| JP | 2008-169237 A | 7/2008 | |
| JP | 2010-18802 A | 1/2010 | |
| JP | 2011-111596 A | 6/2011 | |
| JP | 2012-235985 | 12/2012 | |
| JP | 2012-255985 A | 12/2012 | |
| JP | 2013-52604 A | 3/2013 | |
| WO | WO 2010/113412 A1 | 10/2010 | |
| WO | WO 2010/126133 A1 | 11/2010 | |

OTHER PUBLICATIONS

International Search Report (PCT/ISA/210) dated Jul. 22, 2014, by the Japanese Patent Office as the International Searching Authority for International Application No. PCT/JP2014/002284.

* cited by examiner

*Primary Examiner* — Gregory Listvoyb

(74) *Attorney, Agent, or Firm* — Buchanan, Ingersoll & Rooney PC

(57) ABSTRACT

Provided are a block polyamide acid imide having an appropriate solubility in aqueous alkaline solutions, and block polyimides that are obtained using same and have high transparency and a low coefficient of linear thermal expansion (low CTE). The block polyimide comprises blocks configured from repeating structural units represented by defined formula (1A) and blocks configured from repeating structural units represented by defined formula (1B).

5 Claims, No Drawings

BLOCK POLYIMIDE, BLOCK POLYAMIDE ACID IMIDE AND USE THEREOF

TECHNICAL FIELD

The present invention relates to a block polyimide and a block polyamic acid imide, and a use thereof.

BACKGROUND ART

Polyimides generally have excellent heat resistance, mechanical properties and electrical properties, compared with other general purpose resins or engineering plastics. Therefore, polyimides are widely used for various applications as molding materials, composite materials, electrical/electronic materials, optical materials, and the like.

For example, a circuit substrate, such as an HDD suspension substrate or a semiconductor package substrate, typically has a substrate and a patterned polyimide resin layer. The substrate is a metal substrate or a substrate having a circuit pattern; and when the difference in coefficient of linear thermal expansion (CTE) between the substrate and the polyimide resin layer becomes large, warpage of the circuit substrate is likely to occur by heat or the like generated in its usage environment. Such warped circuit substrate is incapable of maintaining precise mount and, thus, there is a demand for reduction of warpage of the circuit substrate caused by heat or the like.

In addition, the patterned polyimide layer is typically obtained by subjecting a photosensitive polyimide precursor composite layer to light exposure through a photomask having a pattern; and then subjecting the exposed layer to a developing treatment (etching) with an alkaline solution. Therefore, the photosensitive polyimide precursor composition layer needs transparency for sufficiently transmitting exposed light (in particular, i-line) and moderate solubility in an alkaline solution.

As a polyimide having high transparency and low coefficient of linear thermal expansion (CTE), a polyimide containing cyclohexanediamine (CHDA) as a diamine component is known (see PTLs 1, 2, 3, and 4). The polyimide containing cyclohexanediamine as a diamine component has low coefficient of linear thermal expansion (CTE) (see, e.g., Example 3 of PTL 1) and, by virtue of its alicyclic structure, has higher transparency than an aromatic polyimide. On the other hand, cyclohexanediamine is generally expensive, and thus cost reduction is achieved by combining with other diamines, such as norbornene diamine (NBDA) (see PTLs 2 and 5). PTL 5 discloses that a block copolymer of an amic acid oligomer containing a structure derived from cyclohexanediamine and an imide oligomer containing a structure derived from other diamines (e.g., norbornene diamine) has high transparency and low coefficient of linear thermal expansion (CTE).

CITATION LIST

Patent Literature

PTL 1
Japanese Patent Application Laid-Open No. 2007-169304
PTL 2
Japanese Patent Application Laid-Open No. 2008-81718
PTL 3
Japanese Patent Application Laid-Open No. 2007-231224
PTL 4
Japanese Patent Application Laid-Open No. 9-176315
PTL 5
WO2010/113412

SUMMARY OF INVENTION

Technical Problem

The layer containing a block polyamic acid imide disclosed in PTL 5, however, has low solubility in an alkaline solution and, thus, patterning of the layer could not be carried out using an alkaline solution. On the other hand, a layer containing polyamic acid (having no imide skeleton) has a problem such that its excessive solubility prevents a highly precise patterning.

The present invention has been achieved in view of such circumstances, and has an object of providing a block polyamic acid imide having moderate solubility in an aqueous alkaline solution, and a block polyimide obtained therefrom which has high transparency and low coefficient of linear thermal expansion (CTE).

Solution to Problem

[1] A block polyimide containing a block composed of repeating structural units represented by formula (1A), and a block composed of repeating structural units represented by formula (1B):

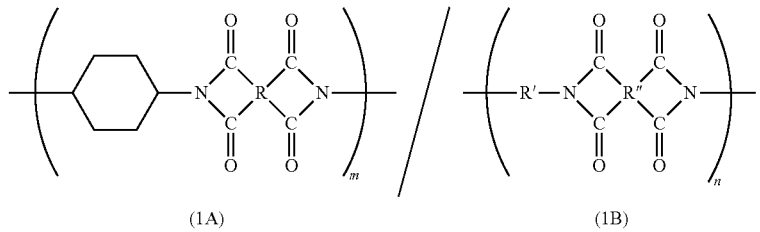

(1A)                    (1B)

in which:

m represents the number of the repeating structural units represented by formula (1A), and n represents the number of the repeating structural units represented by formula (1B), an average value of m is defined as a quotient of the total number of the repeating structural units represented by formula (1A) contained in the block polyimide divided by the number of blocks composed of the repeating structural units represented by formula (1A), an average value of n is defined as a quotient of the total number of the repeating structural units represented by formula (1B) contained in the block polyimide divided by the number of the blocks composed of the repeating structural units represented by formula (1B), and ratio between the average values of m and n (average of m:average of n) is (less than 10:more than 0) to (more than 9:less than 1), R and R" each independently represent a $C_4$-$C_{27}$ tetravalent group which is a monocyclic aliphatic group, condensed polycyclic aliphatic group, monocyclic aromatic group or condensed polycyclic aromatic group, or a non-condensed polycyclic aliphatic group in which cyclic aliphatic groups are mutually linked to each other either directly or via a crosslinking member, or a non-condensed polycyclic aromatic group in which aromatic groups are mutually linked to each other either directly or via a crosslinking member, and R' represents a $C_4$-$C_{51}$ divalent group which is a monocyclic aliphatic group (but exclusive of a 1,4-cyclohexylene group), condensed polycyclic aliphatic group, or non-condensed polycyclic aliphatic group in which cyclic aliphatic groups are mutually linked to each other either directly or via a crosslinking member.

[2] The block polyimide according to [1], in which the average values of m and n each independently are 2 to 1,000.

[3] The block polyimide according to [1] or [2], in which a cyclohexane skeleton in the repeating structural unit represented by formula (1A) is either a trans-isomer represented by formula (1A-1) or a cis-isomer represented by formula (1A-2), and a molar ratio or mass ratio between the trans-isomer and the cis-isomer (trans-isomer:cis-isomer) is 10:0 to 5:5.

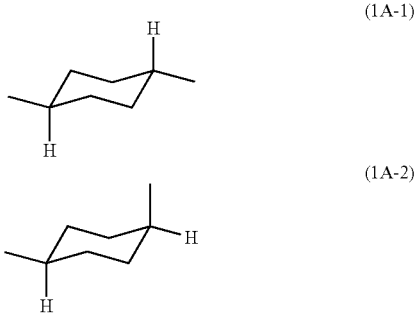

[4] The block polyimide according to any one of [1] to [3] having a logarithmic viscosity of 0.1 to 3.0 dl/g, the logarithmic viscosity being measured in a mixed solvent of p-chlorophenol/phenol=9:1 (weight ratio) at a concentration of 0.5 g/dl and at 35° C.

[5] The block polyimide according to any one of [1] to [4], in which a film of the block polyimide has a glass transition temperature (Tg) of 260° C. or more as measured by TMA method under a tensile mode at a temperature range of 25° C. to 350° C., a temperature-raising rate of 5° C./min., and a load of 14 g/mm².

[6] The block polyimide according to any one of [1] to [5], in which the film of the block polyimide has a coefficient of linear thermal expansion of 30 ppm/K or less as measured by TMA method under a tensile mode at a temperature range of 25° C. to 350° C., a temperature-raising rate of 5° C./min., and a load of 14 g/mm².

[7] The block polyimide according to any one of [1] to [6], in which the film of the block polyimide has a total light transmittance of 80% or more as measured in accordance with JIS K 7105.

[8] A block polyamic acid imide containing a block composed of a repeating structural unit represented by formula (2A) and a block composed of a repeating structural unit represented by formula (2B):

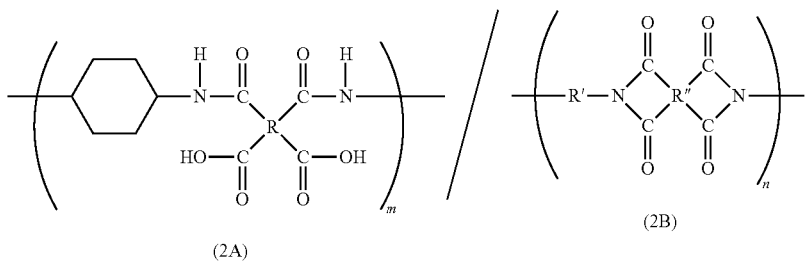

in which:

m represents the number of the repeating structural units represented by formula (2A), and n represents the number of the repeating structural units represented by formula (2B), an average value of m is defined as a quotient of the total number of the repeating structural units represented by formula (2A) contained in the block polyamic acid imide divided by the number of blocks composed of the repeating structural units represented by formula (2A), an average value of n is defined as a quotient of the total number of the repeating structural units represented by formula (2B) contained in the block polyamic acid imide divided by the number of the blocks composed of the repeating structural units represented by formula (2B), and ratio between the average values of m and n (average of m:average of n) is (less than 10:more than 0) to (more than 9:less than 1), R and R" each independently represent a $C_4$-$C_{27}$ tetravalent group which is a monocyclic aliphatic group, condensed polycyclic aliphatic group, monocyclic aromatic group or condensed polycyclic aromatic group, or a non-condensed polycyclic aliphatic group in which cyclic aliphatic groups are mutually linked to each other either directly or via a crosslinking member, or a non-condensed polycyclic aromatic group in which aromatic groups are mutually linked to each other either directly or via a crosslinking member, and R' represents a $C_4$-$C_{51}$ divalent group which is a monocyclic aliphatic group (but exclusive of a 1,4-cyclohexylene group), condensed polycyclic aliphatic group, or non-condensed polycyclic aliphatic group in which cyclic aliphatic groups are mutually linked to each other either directly or via a crosslinking member.

[9] The block polyamic acid imide according to [8], in which the average values of m and n each independently are 2 to 1,000.

[10] The block polyamic acid imide according to [8] or [9], in which a polyimide composed of the repeating structural units represented by formula (2B) is soluble in an aprotic polar solvent.

[11] The block polyamic acid imide according to any one of [8] to [10] having a logarithmic viscosity of 0.1 to 3.0 dl/g, the logarithmic viscosity being measured in N-methyl-2-pyrrolidone solvent or N,N-dimethylacetamide solvent at a concentration of 0.5 g/dl and at 35° C.

[12] The block polyamic acid imide according to any one of [8] to [11], in which a dry film of the block polyamic acid imide having a residual solvent content of 10% by mass and a thickness of 15 μm exhibits a dissolution rate in the range of from 5 to 60 μm/min. at 20° C., the a dissolution rate being measured by immersing the dry film in a 2.38% by mass of aqueous solution of tetramethylammonium hydroxide.

[13] A method of manufacturing the block polyamic acid imide according to any one of [8] to [12], including reacting, in an aprotic polar solvent, a polyamic acid composed of the repeating structural units represented by formula (2A) with a polyimide composed of the repeating structural units represented by formula (2B) which is soluble in an aprotic polar solvent, in which a cyclohexane skeleton in the repeating structural unit represented by formula (2A) is either a trans-isomer represented by formula (2A-1) or a cis-isomer represented by formula (2A-2), and molar ratio or mass ratio between the trans-isomer and the cis-isomer (trans-isomer:cis-isomer) is 10:0 to 5:5.

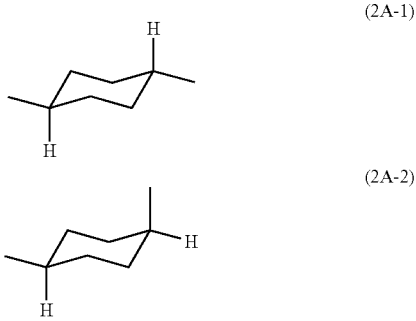

(2A-1)

(2A-2)

[14] A method of manufacturing the block polyamic acid imide according to any one of [8] to [12], including reacting, in an aprotic polar solvent, an amine-terminated polyamic acid represented by formula (2A') with an acid anhydride-terminated polyimide represented by formula (2B') in which the amine-terminated polyamic acid represented by formula (2A') is obtained from 1,4-cyclohexanediamine represented by formula (3) and tetracarboxylic dianhydride represented by formula (4), a molar ratio of the diamine represented by formula (3) to the tetracarboxylic dianhydride represented by formula (4) is more than 1 and 2 or less; and the acid anhydride-terminated polyimide represented by formula (2B') is obtained from a diamine represented by formula (5) and tetracarboxylic dianhydride represented by formula (6), and a molar ratio of the diamine represented by formula (5) to the tetracarboxylic dianhydride represented by formula (6) is 0.5 or more and less than 1.

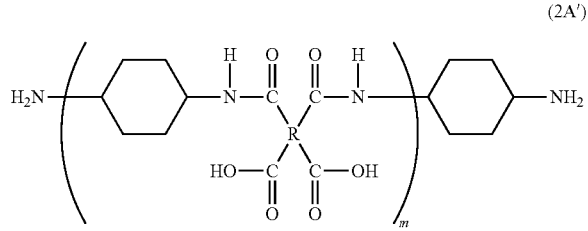

(2A')

(3)

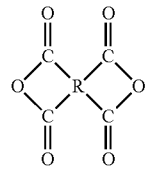

(4)

in which:

R represents a $C_4$-$C_{27}$ tetravalent group which is a monocyclic aliphatic group, condensed polycyclic aliphatic group, monocyclic aromatic group or condensed polycyclic aromatic group, or is a non-condensed polycyclic aliphatic group in which cyclic aliphatic groups are mutually linked to each other either directly or via a crosslinking member, or is a non-condensed polycyclic aromatic group in which aromatic groups are mutually linked to each other either directly or via a crosslinking member; and the 1,4-cyclohexanediamine represented by formula (3) is a trans-isomer represented by formula (3-1) or a cis-isomer represented by formula (3-2), and a molar ratio or mass ratio between the trans-isomer and the cis-isomer (trans-isomer:cis-isomer) is 10:0 to 5:5.

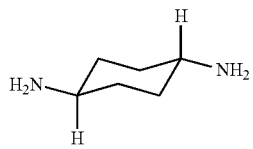

(3-1)

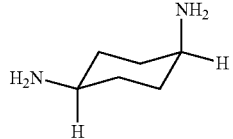

(3-2)

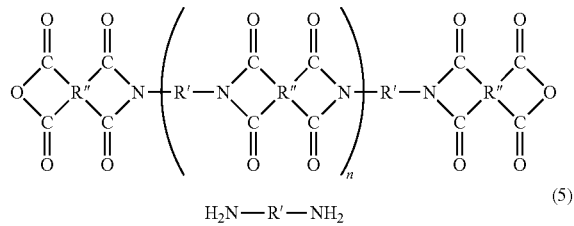

(2B')

$H_2N-R'-NH_2$ (5)

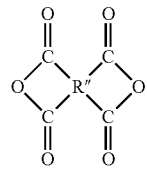

(6)

in which:

R' represents a $C_4$-$C_{51}$ divalent group which is a monocyclic aliphatic group (but exclusive of a 1,4-cyclohexylene group), condensed polycyclic aliphatic group, or non-condensed polycyclic aliphatic group in which cyclic aliphatic groups are mutually linked to each other either directly or via a crosslinking member; and R" represents a $C_4$-$C_{27}$ tetravalent group which is a monocyclic aliphatic group, condensed polycyclic aliphatic group, monocyclic aromatic group or condensed polycyclic aromatic group, or is a non-condensed polycyclic aliphatic group in which cyclic aliphatic groups are mutually linked to each other either directly or via a crosslinking member, or is a non-condensed polycyclic aromatic group in which aromatic groups are mutually linked to each other either directly or via a crosslinking member.

[15] A method of manufacturing the block polyimide according to any one of [1] to [7], including thermally or chemically imidizing the block polyamic acid imide obtained by the method of [13] or [14].

[16] A dry film containing the block polyamic acid imide according to any one of [8] to [12].

[17] An interlayer insulation film material containing the block polyamic acid imide according to any one of [8] to [12].

[18] A block polyamic acid imide varnish containing the block polyamic acid imide according to any one of [8] to [12] and a solvent.

[19] A photosensitive resin composition containing the block polyamic acid imide according to any one of [8] to [12], a photopolymerizable compound, and a photopolymerization initiator.

[20] A laminate containing a metal substrate and the dry film according to [16].

[21] A circuit substrate containing a substrate, a patterned layer having the block polyimide according to any one of [1] to [7], and a patterned conductor layer.

[22] The circuit substrate according to [21], in which the circuit substrate is a suspension substrate or a semiconductor package substrate.

[23] A method of manufacturing a circuit substrate, including: preparing a laminate containing a substrate and a photosensitive resin composition layer consisting of the photosensitive resin composition according to [19]; disposing a patterned photomask on the photosensitive resin composition layer of the laminate; subjecting the photosensitive resin composition layer to light exposure through the photomask, followed by a developing treatment with an aqueous alkaline solution to pattern the photosensitive resin composition layer; and heating the patterned photosensitive resin composition layer to imidize the block polyamic acid imide contained in the photosensitive resin composition.

[24] A polyimide film containing the block polyimide according to any one of [1] to [7].

[25] An optical film containing the polyimide film according to [24].

Advantageous Effects of Invention

According to the present invention, it is possible to provide a block polyamic acid imide having moderate solubility in an aqueous alkaline solution, and a block polyimide obtained by using the same which has high transparency and low CTE.

DESCRIPTION OF EMBODIMENTS

1. Block Polyimide

The block polyimide of the present invention contains a block composed of repeating structural units represented by formula (1A), and a block composed of repeating structural units represented by formula (1B):

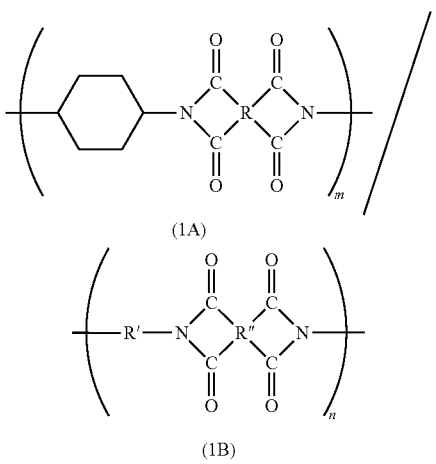

The repeating structural unit represented by formula (1A) is an imide block obtained by reacting 1,4-cyclohexanediamine with a tetracarboxylic anhydride; and the repeating structural unit represented by formula (1B) is an imide block obtained by reacting another diamine (other than 1,4-cyclohexanediamine) with a tetracarboxylic anhydride.

m in formula (1A) represents the number of the "repeating structural units represented by formula (1A)" contained in the "block composed of the repeating structural units represented by formula (1A)"; and n in formula (1B) represents the number of the "repeating structural units represented by formula (1B)" contained in the "block composed of the repeating structural units represented by formula (1B)."

The preferred average values of m and n each independently are 2 to 1,000, and more preferred is 5 to 500. The average value of m is defined as a quotient of the "total number of the repeating structural units represented by formula (1A)" contained in the block polyimide of the present invention divided by the "number of the blocks composed of the repeating structural units represented by formula (1A)." The average value of n is defined as a quotient of the "total number of the repeating structural units represented by formula (1B)" contained in the block polyimide of the present invention divided by the "number of the blocks composed of the repeating structural units represented by formula (1B)."

The number of the repeating structural units in each block can be measured, for example, by the following method. An oligomer represented by formula (2A') mentioned below is reacted with a labeled end capping agent to obtain a first labeled oligomer. Likewise, an oligomer represented by formula (2B') mentioned below is reacted with a labeled end capping agent to obtain a second labeled oligomer. Next, the number of the repeating structural units in each block can be determined by measuring the number of labeled terminal groups in each oligomer by $^1$H-NMR spectroscopy or the like. Furthermore, the number of the repeating structural units in each block can also be determined by measuring the absolute molecular weight of each oligomer using Gel Permeation Chromatography (GPC) equipped with a multi-angle light scattering photometer (MALLS).

In addition, the ratio between the average values of m and n can be determined simply from the charging ratio of the monomers (diamine and tetracarboxylic anhydride) constituting each oligomer (amic acid oligomer and imide oligomer), and from the charging ratio of each oligomer constituting the block polyamic acid imide.

Further, in every "block composed of the repeating structural units represented by formula (1A)" contained in the block polyimide of the present invention, the number of the repeating structural units represented by formula (1A) is preferably 2 or more, more preferably 5 or more, and even more preferably 10 or more. In addition, from the viewpoint of maintaining the compatibility between the oligomer represented by formula (2A') mentioned below and the oligomer represented by formula (2B') mentioned below, the number of the repeating structural units represented by formula (1A) is preferably 50 or less. Thus, every "block composed of the repeating structural units represented by formula (1A)" in the block polyimide of the present invention contains at least a certain number of the repeating structural units, and such structure enables the block polyimide to easily exhibit a property derived from the block.

Furthermore, the ratio between the number m of the repeating structural units represented by formula (1A) and the number n of the repeating structural units represented by formula (1B) which is defined as the ratio of the average values of m and n (average of m:average of n) is preferably (less than 10:more than 0) to (more than 9:less than 1), and more preferably (less than 9.9:more than 0.1) to (more than 9.1:less than 0.9). When the number m of the of the repeating structural units represented by formula (1A) is equal to or more than a certain number, the linear thermal expansion coefficient of the block polyimide of the present invention is likely to be decreased, and the visible light transmittance is likely to be increased. On the other hand, cyclohexanediamine is generally expensive and, thus, cost reduction can be achieved by reducing the ratio of the number m of the repeating structural units represented by formula (1A).

The ratio between the total number of the repeating structural units represented by formula (1A) and the total number of the repeating structural units represented by formula (1B) contained in the block polyimide of the present invention (i.e., (1A):(1B)) is also preferably (1A):(1B)=(less than 10:more than 0) to (more than 9:less than 1), and more preferably (1A):(1B)=(less than 9.9:more than 0.1) to (more than 9.1:less than 0.9).

In addition, as compared with a random polyimide containing the "repeating structural units represented by formula (1A)", the block polyimide of the present invention containing the "block composed of the repeating structural units represented by formula (1A)" is more likely to exhibit a property derived from cyclohexanediamine, in particular, low linear thermal expansion coefficient.

The cyclohexane skeleton in formula (1A) is a group derived from 1,4-cyclohexanediamine. The cyclohexane skeleton in formula (1A) may have a trans-isomer represented by formula (1A-1) and a cis-isomer represented by formula (1A-2):

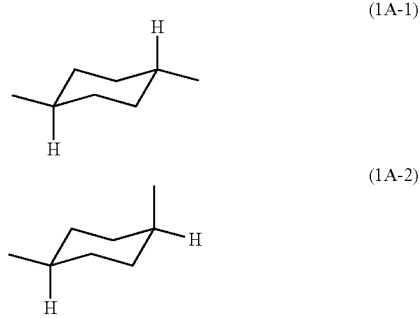

The molar ratio or mass ratio between the trans-isomer and the cis-isomer of the cyclohexane skeleton in formula (1A) is preferably trans-isomer:cis-isomer=10:0 to 5:5, and more preferably trans-isomer:cis-isomer=10:0 to 7:3. Generally, when the ratio of the trans-isomer becomes high, the molecular weight is likely to be increased, thus making it easy to form a self-supporting film, which leads to the easy formation of a film.

R in formula (1A) represents a group derived from tetracarboxylic dianhydride; which is a tetravalent group, preferably a $C_4$-$C_{27}$ tetravalent group. Further, R is preferably a monocyclic aliphatic group, condensed polycyclic aliphatic group, monocyclic aromatic group or condensed polycyclic aromatic group; or is a non-condensed polycyclic aliphatic group in which cyclic aliphatic groups are mutually linked to each other either directly or via a crosslinking member; or is a non-condensed polycyclic aromatic group in which aromatic groups are mutually linked to each other either directly or via a crosslinking member.

The tetracarboxylic dianhydride for obtaining R in formula (1A) may be, for example, an aromatic tetracarboxylic dianhydride or an alicyclic tetracarboxylic dianhydride.

Examples of the aromatic tetracarboxylic dianhydrides include pyromellitic dianhydride, 3,3',4,4'-biphenyltetracarboxylic dianhydride, 3,3',4,4'-benzophenonetetracarboxylic dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 2,3,6,7-naphthalenetetracarboxylic dianhydride, 1,4,5,8-naphthalenetetracarboxylic dianhydride, 2,2',3,3'-benzophenonetetracarboxylic dianhydride, 2,2',3,3'-biphenyltetracarboxylic dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl)ether dianhydride, bis(2,3-dicarboxyphenyl)sulfide dianhydride, bis(2,3-dicarboxyphenyl)sulfone dianhydride, 1,3-bis(2,3-dicarboxyphenoxy)benzene dianhydride, 1,4-bis(2,3-dicarboxyphenoxy)benzene dianhydride, 1,2,5,6-naphthalenetetracarboxylic dianhydride, 1,3-bis(3,4-dicarboxybenzoyl)benzene dianhydride, 1,4-bis(3,4-dicarboxybenzoyl)benzene dianhydride, 1,3-bis(2,3-dicarboxybenzoyl)benzene dianhydride, 1,4-bis(2,3-dicarboxybenzoyl)benzene dianhydride, 4,4'-isophthaloyldiphthalic anhydride, diazodiphenylmethane-3,3',4,4'-tetracarboxylic dianhydride, diazodiphenylmethane-2,2',3,3'-tetracarboxylic dianhydride, 2,3,6,7-thioxanthonetetracarboxylic dianhydride, 2,3,6,7-anthraquinonetetracarboxylic dianhydride, 2,3,6,7-xanthonetetracarboxylic dianhydride, ethylenetetracarboxylic dianhydride, and fluorenylidene bis phthalic anhydride.

Examples of the alicyclic tetracarboxylic dianhydrides include cyclobutanetetracarboxylic dianhydride, 1,2,3,4-cyclopentanetetracarboxylic dianhydride, 1,2,4,5-cyclohexanetetracarboxylic dianhydride, bicyclo[2.2.1]heptane-2,3,5,6-tetracarboxylic dianhydride, bicyclo[2.2.2]octo-7-ene-2,3,5,6-tetracarboxylic dianhydride, bicyclo[2.2.2]octane-2,3,5,6-tetracarboxylic dianhydride, 2,3,5-tricarboxycyclopentylacetic dianhydride, bicyclo[2.2.1]heptane-2,3,5-tricarboxylic-6-acetic dianhydride, 1-methyl- 3-ethylcyclohexa-1-ene-3-(1,2),5,6-tetracarboxylic dianhydride, decahydro-1,4,5,8-dimethanonaphthalene-2,3,6,7-tetracarboxylic dianhydride, 4-(2,5-dioxotetrahydrofuran-3-yl)-tetralin-1,2-dicarboxylic dianhydride, and 3,3',4,4'-dicyclohexyltetracarboxylic dianhydride.

When the tetracarboxylic dianhydride contains an aromatic ring such as a benzene ring, some or all of the hydrogen atoms in the aromatic ring may be substituted by a group selected from a fluoro group, a methyl group, a methoxy group, a trifluoromethyl group, and a trifluoromethoxy group. In addition, when the tetracarboxylic dianhydride contains an aromatic ring such as a benzene ring, the tetracarboxylic dianhydride may have a group serving as a crosslinking site selected from an ethynyl group, a benzocyclobutene-4'-yl group, a vinyl group, an allyl group, a cyano group, an isocyanate group, a nitrilo group, an isopropenyl group, and the like, depending on purposes. A group serving as a crosslinking site such as a vinylene group, a vinylidene group or an ethylidene group may be preferably incorporated into the main chain skeleton of the tetracarboxylic dianhydride in such a range as not to impair moldability.

It is noted that, for introducing branches to the polyamide or polyimide, the tetracarboxylic dianhydride component may contain a hexacarboxylic trianhydride or an octacarboxylic tetraanhydride as a part thereof.

The tetracarboxylic dianhydride component can be a single compound or a mixture of two or more compounds.

R' in formula (1B) is a group derived from a diamine other than 1,4-cyclohexanediamine; and is a divalent group other than a 1,4-cyclohexylene group, preferably a $C_4$-$C_{51}$ divalent group. Specifically, R' is preferably a monocyclic aliphatic group (but exclusive of a 1,4-cyclohexylene group), condensed polycyclic aliphatic group, or non-condensed polycyclic aliphatic group in which cyclic aliphatic groups are mutually linked to each other either directly or via a crosslinking member.

For increasing the transparency of a film containing the block polyimide, the diamine other than 1,4-cyclohexanediamine, which is for obtaining R' in formula (1B), is preferably an alicyclic diamine.

Examples of the alicyclic diamines include cyclobutanediamine, di(aminomethyl)cyclohexane [bis(aminomethyl) cyclohexanes including trans-1,4-bis(aminomethyl)cyclohexane, 1,3-bis(aminomethyl)cyclohexane, and the like], diaminobicycloheptane, diaminomethylbicycloheptane (including norbornanediamines such as norbornanediamine), diaminooxybicycloheptane, diaminomethyloxybicycloheptane (including oxanorbornanediamine), isophoronediamine, diaminotricyclodecane, diaminomethyltricyclodecane, bis(aminocyclohexyl)methane [or methylenebis(cyclohexylamine)], and bis(aminocyclohexyl)isopropylidene.

R" in formula (1B) is a group derived from tetracarboxylic dianhydride; and is a tetravalent group, preferably a $C_4$-$C_{27}$ tetravalent group. R" may be defined in the same manner as R in formula (1A).

The polyimide or imide oligomer composed of the repeating structural units represented by formula (1B) is preferably soluble in an aprotic polar solvent. As such an aprotic polar solvent, for example, an aprotic amide solvent can be used. Examples of the aprotic amide solvents include: N,N-dimethylformamide, N,N-dimethylacetamide, N,N-diethylacetamide, N-methyl-2-pyrrolidone, 1,3-dimethyl-2-imidazolidinone, N-methylcaprolactam, and hexamethylphosphorotriamide; among these amide solvents, N,N-dimethylformamide, N,N-dimethylacetamide, N,N-diethylacetamide, N-methyl-2-pyrrolidone, and 1,3-dimethyl-2-imidazolidinone are preferred. The term "soluble" means that the solubility is 10 g/l or more, and more preferably 100 g/l or more.

As described below, the block polyimide of the present invention is obtained by reacting an imide oligomer composed of the repeating structural units represented by formula (2B) with an amic acid oligomer composed of the repeating structural units represented by formula (2A) in an aprotic polar solvent to obtain a block polyamic acid imide; and imidizing the obtained block polyamic acid imide. Here, when the polyimide composed of the repeating structural units represented by formula (2B) is soluble in the aprotic polar solvent, the imide oligomer composed of the repeating structural units represented by formula (2B) and the amic acid oligomer composed of the repeating structural units represented by formula (2A) can be mixed homogeneously and enables an easy obtainment of the block polyamic acid imide.

The logarithmic viscosity of the block polyimide of the present invention (concentration: 0.5 g/dl) in a mixed solvent of p-chlorophenol/phenol=9:1 (weight ratio) as measured at 35° C. is preferably 0.1 to 3.0 dl/g. When the logarithmic viscosity is within this range, the block polyimide has a practical molecular weight, and the solution can be easily applied at a desired solid content concentration. When the logarithmic viscosity is too high, polymerization generally becomes difficult, and in addition the solubility sometimes may be lowered.

The glass transition temperature (Tg) of a film of the block polyimide of the present invention is preferably 260° C. or more, and more preferably 280° C. or more, for example, for the purpose of achieving high heat resistance.

The glass transition temperature of a film can be measured by the following procedures. Specifically, TMA measurement of a test sample (5 mm×22 mm) made from the block polyimide is performed using a measuring apparatus TMA-50 (manufactured by Shimadzu Corporation). The measurement conditions may be a temperature range of 25° C. to 350° C., a temperature-raising rate of 5° C./min., a load of 14 g/mm$^2$, and a tensile mode. Then, the glass transition temperature (Tg) is determined from an inflection point of the obtained temperature-test sample elongation curve.

For reducing the below-described warpage of a circuit substrate and the like, the linear thermal expansion coefficient of a film of the block polyimide of the present invention is preferably 30 ppm/K or less, and more preferably 20 ppm/K or less. The linear thermal expansion coefficient of the film can be determined from a slope of the temperature-test sample elongation curve within the interval of from 100° C. to 200° C. obtained by the TMA measurement described above.

The total light transmittance of a film of the block polyimide of the present invention measured in accordance with JIS K 7105 is preferably 80% or more, and more preferably 82% or more. The above-mentioned total light transmittance is preferably the total light transmittance of a 15 μm thick film made from the block polyimide.

In the block polyimide of the present invention, the average value of the number m of the repeating structural units represented by formula (1A) is adjusted to a high value. By virtue of such property, the film of the block polyimide of the present invention may have a low coefficient of linear thermal expansion (CTE). In addition, the film of the block polyimide of the present invention may have high transparency, since the diamine units constituting formulas (1A) and (1B) are both cyclic aliphatic groups.

The block polyimide of the present invention may be used as a film. The film of the present invention may be layered. That is, the polyimide film of the present invention contains the block polyimide of the present invention, and may further contain other components such as a cured product of a photopolymerizable compound, as necessary.

2. Block Polyamic Acid Imide

The block polyamic acid imide of the present invention contains a block composed of repeating structural units represented by formula (2A), and a block composed of repeating structural units represented by formula (2B):

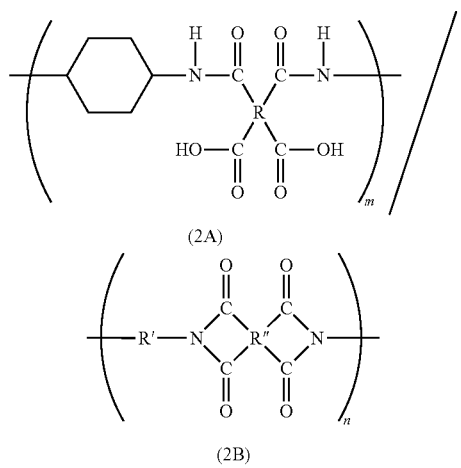

(2A)

(2B)

The block polyamic acid imide of the present invention also serves as a precursor for the above-mentioned block polyimide. That is, the block composed of the repeating structural units represented by formula (2A) corresponds to the block composed of the repeating structural units represented by formula (1A); and the block composed of the repeating structural units represented by formula (2B) corresponds to the block composed of the repeating structural units represented by formula (1B). Accordingly, R and m in formula (2A) are defined in the same manner as R and m in formula (1A). Likewise, R', R" and n in formula (2B) are defined in the same manner as R', R" and n in formula (1B).

Specifically, the ratio between the number m of the repeating structural units represented by formula (2A) and the number n of the repeating structural units represented by formula (2B) preferably satisfies the relationship: (average of m:average of n)=(less than 10:more than 0) to (more than 9:less than 1), and more preferably: (average of m:average of n)=(less than 9.9:more than 0.1) to (more than 9.1:less than 0.9). When the value of m of the repeating structural units represented by formula (2A) is 10, the block polyamic acid imide is excessively soluble in an aqueous alkaline solution during the developing treatment, thus making it difficult to carry out highly precise patterning. On the other hand, when the value of m is 9 or less, the block polyamic acid imide is poorly soluble in an aqueous alkaline solution during the developing treatment, thus making it impossible to carry out sufficient patterning.

The logarithmic viscosity at 35° C. of a solution of the block polyamic acid imide of the present invention (concentration: 0.5 g/dl) in N-methyl-2-pyrrolidone as a solvent is preferably 0.1 to 3.0 dl/g. Easiness of the application of such polyamic acid solution increases the usability as a varnish.

The dissolution rate at 20° C. of a 15 μm thick dry film made of the block polyamic acid imide, measured by immersing the dry film in a 2.38% by mass aqueous solution of tetramethylammonium hydroxide is preferably 5 to 60 μm/min., and more preferably 10 to 50 μm/min.

The dissolution rate of the film can be measured by the following method:

1) A varnish of the block polyamic acid imide is coated onto a substrate, such as a glass plate or a silicon wafer. The substrate with the coated varnish is dried (prebaked) at 80° C. for 15 minutes under a nitrogen stream to thereby obtain a dried coated film. The residual solvent content of the dried (prebaked) coated film (dry film) may be 10% by mass; and the thickness of the film may be 15 μm.

2) Subsequently, the substrate having the dry film is immersed in a 2.38% aqueous solution of tetramethylammonium hydroxide (TMAH) adjusted to 20° C., while vibrating the substrate. The vibration may be imparted by ultrasonication, a water stream or a vibrating motor, preferably by a vibrating motor. The vibration frequency is set to 1 Hz.

3) Then, the time necessary for the dry film on the substrate to be dissolved and vanished is measured. A quotient of the initial thickness of the film divided by the time taken by the film to vanish is set as the "dissolution rate (unit: μm/min.)."

The solubility of the film composed of the block polyamic acid imide in the aqueous alkaline solution may be adjusted by the ratio between the average values of m and n, as described above. The solubility can be increased by, for example, increasing the average value of m, and decreasing the average value of n.

In the block polyamic acid imide of the present invention, the average value of m of the repeating structural units represented by formula (2A) is adjusted to a high value, and thus the film containing the block polyamic acid imide may have moderate solubility in the aqueous alkaline solution. Therefore, the dry film containing the block polyamic acid imide of the present invention can be subjected to a highly precise developing treatment after light exposure depending on patterns of the photomask.

In addition, in the block polyamic acid imide of the present invention, the diamine unit is composed of cyclic aliphatic groups. Thus, the dry film containing such block polyamic acid imide has excellent transparency, and may exhibit excellent transmittance of the light used for exposure.

The block polyamic acid imide of the present invention is used as a varnish or a dry film. The dry film of the present invention may be layered.

The varnish containing the block polyamic acid imide of the present invention may further contain a solvent. The concentration of the block polyamic acid imide in the varnish is not particularly limited. Since higher concentration makes it easier to remove the solvent by drying, for example, the block polyamic acid imide concentration of at least 15 wt % is satisfactory. Since excessively high block polyamic acid imide concentration makes the application of the varnish difficult, for example, the block polyamic acid imide concentration of 50 wt % or less is satisfactory. The solvent in the varnish is preferably an aprotic polar solvent.

With respect to the dry film containing the block polyamic acid imide of the present invention, the residual solvent content is preferably adjusted to not more than a certain value.

The residual solvent content of the dry film is preferably 3 to 20% by mass, and more preferably 10% by mass or less, for adjusting the solubility of the dry film in the aqueous alkaline solution to fall within a moderate range. Higher residual solvent content of the dry film tends to increase the dissolution rate in the aqueous alkaline solution.

The residual solvent content of the dry film can be measured by the following method. An electric furnace type pyrolyzer (PYR-2A manufactured by Shimadzu Corporation (pyrolysis temperature: 320° C.)) and a gas chromatography mass spectrometer (GC-8A (column Uniport HP 80/100 KG-02) manufactured by Shimadzu Corporation) are connected together. The dry film is charged into the electric furnace type pyrolyzer and immediately heated at 320° C. to generate volatile components, followed by an analysis of the volatile components with the gas chromatography mass spectrometer. The injector temperature and the detector temperature of the gas chromatography mass spectrometer may be set at 200° C., and the column temperature may be set at 170° C. An area of the relevant peak in the obtained GC chart is calculated, and the calculated peak area is collated with a calibration curve of the solvent prepared in advance, thereby determining the solvent content of the dry film.

The thickness of the dry film depends on its use, but it is preferably 1 to 100 μm, more preferably 5 to 50 μm when the dry film is used as an interlayer insulating layer of the circuit substrate.

The dry film of the present invention can be obtained by applying the block polyamic acid imide varnish of the present invention onto a carrier film, followed by drying (prebaking). The drying temperature may be, for example, about 80° C. to 150° C.

For example, when the dry film is photosensitive, the carrier film is sometimes required to have transparency that enables light exposure of the dry film through the carrier film and to have low moisture permeability. Therefore, the carrier film is preferably a film of polyethylene terephthalate, polyethylene, polypropylene and the like.

Further, the surface of the dry film of the present invention is preferably protected by a cover film. The cover film is not particularly limited insofar as it is a film having low moisture permeability.

The varnish or dry film of the present invention may further contain the above-mentioned other components as necessary, and the varnish or dry film is preferably a photosensitive resin composition further containing a photosensitivity-imparting component (such as a photopolymerizable compound, or a photopolymerization initiator).

Photosensitive Resin Composition

The photosensitive resin composition contains (a) the block polyamic acid imide of the present invention, (b) a photopolymerizable compound, and (c1) a photopolymerization initiator or (c2) a photopolymerization accelerator; and may further contain (d) an epoxy compound and (e) a curing agent, as necessary.

The (b) photopolymerizable compound contained in the photosensitive resin composition is a compound having two or more photopolymerizable unsaturated double bonds. Examples of the compound having two or more photopolymerizable unsaturated double bonds include (meth)acrylates, (meth)acrylic acid, styrene, α-alkylstyrene, and diallylphthalates, and preferred is (meth)acrylates.

Examples of the (meth)acrylates include ethyl(meth)acrylate, butyl (meth)acrylate, 2-hydroxyethyl (meth)acrylate, 2-hydroxypropyl (meth)acrylate, oligoester (meth)monoacrylate, ethylene glycol di(meth)acrylate, polyethylene glycol diacrylate, neopentyl glycol (meth)acrylate, tetramethylolmethane di(meth)acrylate, trimethylolpropane di(meth) acrylate, ditrimethylolpropane tetra(meth)acrylate, pentaerythritol tri(meth)acrylate, dipentaerythritol penta(meth)acrylate, dipentaerythritol hexa(meth)acrylate, 2-hydroxy-1-(meth)acryloxy-3-(meth)acrylate, epoxy acrylate (e.g., bisphenol A type epoxy (meth)acrylate, novolac-type epoxy (meth)acrylate, cresol novolac-type epoxy (meth) acrylate, and carboxyl group-containing cresol novolac-type epoxy (meth)acrylate), and urethane (meth)acrylate.

The content of the (b) photopolymerizable compound is 3 to 400 parts by mass, and preferably 10 to 100 parts by mass, based on 100 parts by mass of the block polyamic acid imide.

Examples of the (c1) photopolymerization initiator contained in the photosensitive resin composition include benzophenone, methylbenzophenone, o-benzoyl benzoic acid, benzoylethylether, 2,2-diethoxyacetophenone, and 2,4-diethylthioxanthone; sulfonium salt compounds; and oxime ester compounds. Examples of the (c2) photopolymerization accelerator include p-dimethylbenzoic acid isoamyl, 4,4-bis (diethylamino)benzophenone, and dimethylethanolamine. The total content of the (c1) photopolymerization initiator and the (c2) photopolymerization accelerator may be about 0.05 to 10% by mass based on the photopolymerizable compound.

As described above, the photosensitive resin composition may further contain (d) an epoxy compound or (e) a curing agent, as necessary, for example, for the purpose of enhancing the coating strength and the heat resistance of the cured product.

Examples of the (d) epoxy compound include triglycidyl isocyanurate, hydroquinone diglycidyl ether, bisphenol diglycidyl ether, a cresol novolac-type epoxy resin, and a phenol novolac-type epoxy resin.

The (e) curing agent may be a latent thermosetting agent, a thermosetting agent which is a solid at normal temperature, and a thermosetting accelerator. As such curing agents, conventional agents, for example, one curing agent or two or more curing agents having excellent storage stability can be selected from those described in "Shin Epokishi-Jyushi (New Epoxy Resin)" (Shokodo Co., Ltd., May, Sho. 60 (1985)), pp. 164-263 and pp. 356-405, and in "Kakyo-Zai Hando-Bukku (Crosslinking Agent Handbook)" (Taiseisha Ltd., October, Sho. 56 (1981)), pp. 606-655.

Examples of the latent thermosetting agents include boron trifluoride-amine complex, dicyandiamide (DICY) and a derivative thereof; organic acid hydrazide, diamino maleonitrile (DAMN), and a derivative thereof; melamine and a derivative thereof; amine imide (AI), and salts of polyamine. Examples of the thermosetting agents which are solid at normal temperature include aromatic amines such as meta-phenylene diamine (MP-DA), diaminodiphenylmethane (DDM), diaminodiphenylsulfone (DDS), and "Hardener HT972" manufactured by Ciba-Geigy Ltd.; aromatic anhydrides, such as phthalic anhydride, trimellitic anhydride, ethylene glycol bis(anhydrotrimellitate), glycerol tris(anhydrotrimellitate), and 3,3',4,4'-benzophenonetetracarboxylic anhydride; and cyclic aliphatic anhydrides, such as maleic anhydride, succinic anhydride, and tetrahydro phthalic anhydride. Examples of the thermosetting accelerator include metal salts of acetyl acetone, such as acetyl acetonate Zn, and acetyl acetonate Cr; enamine, tin octylate, quaternary phosphonium salt, triphenylphosphine, 1,8-diazabicyclo(5,4,0)undecene-7, and a 2-ethyl hexanoic acid salt and a phenol salt thereof; imidazole, an imidazolium salt, and triethanolamine borate.

The photosensitive resin composition may further contain (f) an organic solvent or water, and (g) other additives, as necessary. Examples of the (g) other additives include a dye/pigment or an ion-trapping agent for facilitating the confirmation of the coating properties of the composition; an organic/inorganic filler for facilitating the adjustment of fluidity, the decrease of cure shrinkage, the adjustment of viscosity, and development; a polymerization inhibitor for preventing dark reactions and enhancing storage stability; other antifoaming agents; and a thermopolymerization initiator.

Examples of the dyes/pigments include phthalocyanine green, phthalocyanine blue, carbon black, quinacridone red, diazo yellow, and titanium oxide. Examples of the ion-trapping agents include inorganic or organic ion exchangers; specific examples thereof include an inorganic ion exchanger IXE (manufactured by Toagosei Co., Ltd.) and an ion exchanging resin "DIAION" (manufactured by Mitsubishi Chemical Corporation). Examples of the organic/inorganic fillers include organic fillers obtained by polymerizing a resin (such as an epoxy resin, a melamine resin, an urea resin, an acrylic resin, a polyimide resin, a Teflon (registered trademark) resin, a polyethylene resin, a polyester resin, or a polyamide resin) to a degree such that it becomes insoluble in a solvent to be used, followed by micronization thereof; and inorganic fillers such as silica, talc, magnesium carbonate, calcium carbonate, natural mica, synthetic mica, aluminum hydroxide, sedimentary barium sulfate, sedimentary barium carbonate, barium titanate, and barium sulfate. Either one of the above-mentioned fillers, or a mixture of two or more fillers may be used. The above-mentioned fillers are microparticles having an average particle diameter of preferably 10 μm or less, and more preferably 5 μm or less. Examples of the polymerization inhibitors include hydroquinone, and phenothiazine. Examples of the antifoaming agents include a silicone compound and a hydrocarbon compound.

3. Method of Manufacturing Block Polyamic Acid Imide and Block Polyimide

The block polyamic acid imide of the present invention can be obtained by reacting the polyamic acid (amic acid oligomer) composed of the repeating structural units represented by the formula (2A) with the polyimide (imide oligomer) composed of the repeating structural units represented by the formula (2B). The reaction is preferably carried out in a solvent, and more preferably in an aprotic polar solvent.

The block polyamic acid imide of the present invention is obtained using as a raw material, the amic acid oligomer composed of the repeating structural units represented by formula (2A); the amic acid oligomer is preferably an amine-terminated amic acid oligomer, as represented by formula (2A'). R and m of formula (2A') are defined in the same manner as in R and m of formula (2A). The logarithmic viscosity of the amic acid oligomer (concentration: 0.5 g/dl) in N-methyl-2-pyrrolidone as a solvent at 35° C. is preferably 0.1 to 3.0 dl/g, and more preferably 0.3 to 3.0 dl/g.

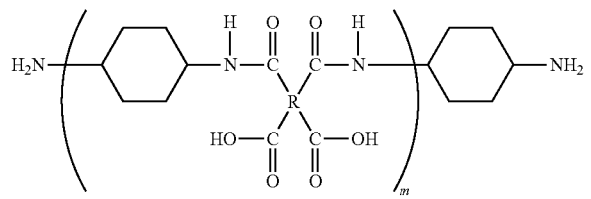

(2A')

In addition, the block polyamic acid imide of the present invention is obtained, using as a raw material, the imide oligomer composed of the repeating structural units represented by formula (2B); the imide oligomer is preferably an acid anhydride-terminated imide oligomer, as represented by formula (2B'). R', R" and n of formula (2B') are defined in the same manner as in R', R" and n of formula (2B). The logarithmic viscosity of the imide oligomer (concentration: 0.5 g/dl) with N-methyl-2-pyrrolidone as a solvent at 35° C. is preferably 0.01 to 3.0 dl/g, and more preferably 0.02 to 2.0 dl/g.

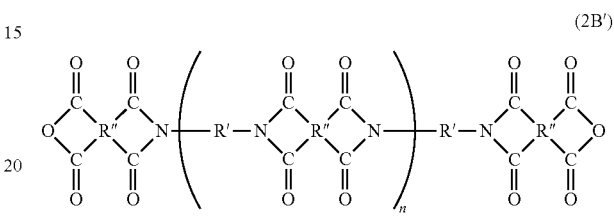

(2B')

It is to be noted that when the terminal of the amic acid oligomer represented by formula (2A) is an acid anhydride terminal and when the terminal of the imide oligomer represented by formula (2B) is an amine terminal, gelation easily occurs during thermal imidization reaction. While the reason for the gelation is not clear, it is presumed that excessive amine components and acid anhydride structures form excessive bonds other than the imide bonds and form crosslinking structures.

The amic acid oligomer represented by formula (2A') is obtained by polyaddition reaction between 1,4-cyclohexanediamine represented by formula (3) and tetracarboxylic dianhydride represented by formula (4). Here, the molar ratio between the diamine of formula (3) and the tetracarboxylic dianhydride of formula (4) (tetracarboxylic dianhydride of formula (4)/diamine of formula (3)) to be subjected to the polyaddition reaction is preferably 0.5 or more and less than 1.0, and more preferably 0.7 or more and less than 1, in order to obtain an amine-terminated amic acid oligomer in which the molecular weight is properly controlled.

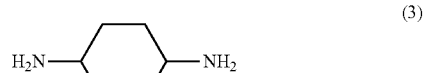

(3)

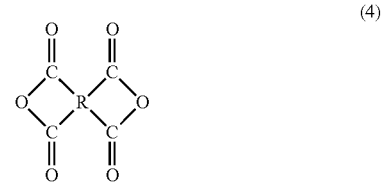

(4)

The 1,4-cyclohexanediamine represented by formula (3) is composed of a trans-isomer represented by formula (3-1) and a cis-isomer represented by formula (3-2). Among 1,4-cyclohexanediamine molecules subjected to the reaction, the ratio between the trans-isomer and the cis-isomer (trans-isomer:cis-isomer) is preferably 10:0 to 5:5. When trans-isomer ratio is high, a self-supporting film can be easily formed using the obtained polyimide, thus increasing the film-formability of the polyimide.

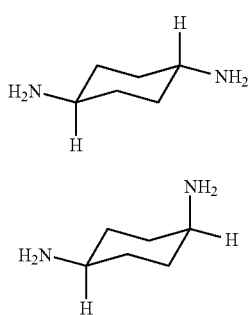

(3-1)

(3-2)

R of formula (4) is a tetravalent group defined in the same manner as R of the formula (1A).

The imide oligomer represented by formula (2B') is obtained by dehydration condensation reaction between a diamine represented by formula (5) and tetracarboxylic dianhydride represented by formula (6), and imidization reaction. Here, in order to obtain an acid anhydride-terminated imide oligomer having a properly controlled molecular weight, the molar ratio between the diamine of formula (5) and the tetracarboxylic dianhydride of formula (6) (diamine of formula (5)/tetracarboxylic dianhydride of formula (6)) to be subjected to the dehydration condensation reaction is preferably 0.5 or more and less than 1.0, and more preferably 0.7 or more and less than 1.

(5)

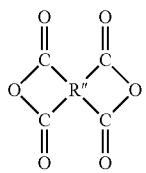

(6)

The polyaddition reaction or dehydration condensation reaction between the diamine and the tetracarboxylic dianhydride is preferably carried out in a reaction solvent. The reaction solvent may be an aprotic polar solvent or a water-soluble alcoholic solvent, with the aprotic polar solvent being preferred. Examples of the aprotic polar solvents include: N-methyl-pyrrolidone, N,N-dimethylformamide, N,N-dimethylacetamide, 1,3-dimethyl-2-imidazolidinone, dimethylsulfoxide, and hexamethylphosphoramide; and ether compounds such as 2-methoxyethanol, 2-ethoxyethanol, 2-(methoxymethoxy)ethoxyethanol, 2-isopropoxyethanol, 2-butoxyethanol, tetrahydrofurfurylalcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, and diethylene glycol diethyl ether. Examples of the water-soluble alcoholic solvent include methanol, ethanol, 1-propanol, 2-propanol, tert-butylalcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol, and diacetone alcohol.

As the solvent for the polyaddition reaction or the dehydration condensation reaction, either one of the above-mentioned solvents or a mixture of two or more solvents can be used. Among those, preferable examples of the solvents include N,N-dimethylacetamide, N-methyl-pyrrolidone, 1,3-dimethyl-2-imidazolidinone, and a combination thereof.

The amic acid oligomer composed of the units represented by formula (2A) (preferably represented by formula (2A')) is mixed with the imide oligomer composed of the units represented by formula (2B) (preferably represented by formula (2B')) in an aprotic polar solvent to obtain a block polyamic acid imide. The aprotic polar solvent is not particularly limited insofar as it dissolves the imide oligomer composed of the units of formula (2B), and may be N-methyl-2-pyrrolidone, for example. The mixing method may be mixing with a three-one motor, homomixer, planetary mixer, homogenizer, or viscosity material mixer and defoamer, for example. It is also possible to mix the oligomers while warming the reaction system to a temperature in the range of from 10° C. to 150° C.

The obtained block polyamic acid imide may be converted into a block polyimide through imidization. The means for imidization is not particularly limited insofar as the imidization is carried out thermally or chemically. The procedure for imidization is not particularly limited, although there are procedures set forth below, for example. As described above, a coated film of a varnish may be imidized, as a matter of course.

(1) A method in which the block polyamic acid imide in a solvent is imidized by heating to 100° C. to 400° C. (thermal imidization);

(2) A method in which the block polyamic acid imide in a solvent is imidized chemically using an imidizing agent such as acetic anhydride (chemical imidization); and (3) A method in which the block polyamic acid imide in a solvent is imidized in the presence of an azeotropic dehydration solvent and in the presence or absence of a solvent (azeotropic dehydration ring closure method).

4. Use of Block Polyamic Acid Imide of the Present Invention

The block polyamic acid imide of the present invention can be preferably used as a varnish or a dry film for an interlayer insulation film material; in particular for an interlayer insulation film material of a circuit substrate.

The circuit substrate contains a substrate, a patterned layer containing the block polyimide of the present invention, and a patterned conductor layer. The patterned layer containing the block polyimide of the present invention is obtained from a varnish or a dry film containing the block polyamic acid imide of the present invention, and serves as an interlayer insulating layer or a cover insulating layer of the circuit substrate. The circuit substrate may be an HDD suspension substrate, multilayer printed wiring board, semiconductor package substrate, or the like.

The substrate may be a metal substrate or inner layer circuit substrate. The material for the metal substrate may be copper, copper alloy, stainless steel, or the like. The inner layer circuit substrate may be a resin substrate (such as glass epoxy substrate, polyimide substrate, or polyester substrate) having a circuit pattern.

The thickness of the patterned layer containing the block polyimide of the present invention is preferably about 1 to 100 μm, and more preferably about 5 to 50 μm, although it depends on applications.

The material for the conductor layer composed of the wiring circuit pattern may be copper, copper alloy, indium tin oxide (ITO), graphene, an organic conductor, or the like. The conductor layer may be formed by electroless plating, for example.

Such circuit substrates can be produced using a varnish or dry film containing the block polyamic acid imide of the present invention. In particular, a photosensitive varnish or dry film (above-mentioned photosensitive resin composition) containing the block polyamic acid imide of the present invention is preferably used for the production, since it becomes possible to simplify the manufacturing processes.

That is, the circuit substrate may be manufactured through the steps of: 1) preparing a laminate containing a substrate and a photosensitive resin composition layer consisting of the above-mentioned photosensitive resin composition containing the block polyamic acid imide of the present invention; 2) disposing a photomask having a pattern on the photosensitive resin composition layer; 3) subjecting the photosensitive resin composition layer to light exposure through the photomask, followed by a developing treatment using an aqueous alkaline solution to pattern the photosensitive resin composition layer; and 4) heating the patterned photosensitive resin composition layer to imidize the block polyamic acid imide contained in the resin composition.

In step 1), a laminate containing a substrate and a layer composed of the photosensitive resin composition containing the block polyamic acid imide of the present invention is obtained.

When obtaining, for example, an interlayer insulating layer for an HDD suspension substrate, a metal substrate, such as stainless foil, can be prepared for the substrate. When obtaining an interlayer insulating layer (build-up material) for a semiconductor package substrate, an inner layer circuit substrate can be prepared.

The laminate may be obtained either by applying the block polyamic acid imide varnish onto the substrate, followed by drying; or by vacuum-lamination of the substrate and the dry film containing the block polyamic acid imide. The vacuum lamination can be carried out while heating the substrate at 80° C. to 120° C., for example.

In step 2), a photomask having a pattern is disposed on the photosensitive resin composition layer of the laminate. The minimum width (line interval) of the pattern of the photomask may be 10 µm or less, preferably 1 µm or less, and more preferably 0.5 µm or less.

In step 3), the photosensitive resin composition layer is subjected to light exposure through the photomask, followed by a developing treatment using an aqueous alkaline solution to pattern the photosensitive resin composition layer.

The exposure light is an electron ray, X-ray, ultraviolet ray (including i-line), visible ray (including g-line), or the like, and preferably an ultraviolet ray or visible ray. The light source may be a high pressure mercury lamp, ultrahigh pressure mercury lamp, low pressure mercury lamp, halogen lamp, or the like. The amount of exposure may be about 100 to 5,000 mJ/cm$^2$.

The aqueous alkaline solution to be used for the developing treatment may be an aqueous tetramethylammonium hydroxide (TMAH) solution, an aqueous sodium carbonate solution, or the like. The alkaline concentration may be within a range of 1 to 10% by weight.

In step 4), the patterned layer composed of the photosensitive resin composition is heated to imidize the block polyamic acid imide contained in the resin composition, so as to obtain a patterned layer containing the block polyimide. The imidization is preferably carried out by heating at 300° C. to 400° C. for few hours under reduced pressure or in an inert gas atmosphere.

As described above, the photosensitive resin composition layer containing the block polyamic acid imide of the present invention has excellent transparency. Thus, it becomes possible to transmit the exposure light such as i-line (365 nm) or g-ray (436 nm) satisfactorily. Further, the photosensitive resin composition layer containing the block polyamic acid imide of the present invention has moderate solubility in an aqueous alkaline solution. Therefore, the photosensitive resin composition layer of the present invention can be subjected to a high-precision patterning in accordance with the patterns of the photomask through the developing treatment.

In addition, the thus obtained patterned layer containing the block polyimide of the present invention has low coefficient of linear thermal expansion (low CTE). Therefore, it becomes possible to reduce warpage of the obtained circuit substrate caused by heat.

Further, when the varnish or dry film containing the block polyamic acid imide of the present invention does not have photosensitivity, the patterned layer containing the block polyimide may be obtained by the following method. Specifically, the patterned block polyimide layer can also be obtained by: forming a patterned photoresist on the layer containing the block polyamic acid imide of the present invention; patterning the layer containing the block polyamic acid imide by removing parts thereof which are not covered with the photoresist by etching with an aqueous alkaline solution; removing the photomask; and heating the resultant layer containing the block polyamic acid imide for imidization.

Furthermore, the film (polyimide film) containing the block polyimide of the present invention may have high transparency and low linear thermal expansion coefficient (dimensional stability) while being less costly. Therefore, the polyimide film of the present invention can also be used as an optical film.

Examples of the optical films include optical films such as polarizing plate protective film, retardation film, antireflection film, electromagnetic wave shielding film, and transparent conductive film; and panel transparent substrates used for image display apparatuses such as a flexible display substrate, a flat panel display substrate, an inorganic/organic EL display substrate, a touch panel substrate, and an electronic paper substrate.

The polyimide film to be used as the panel transparent substrate used for image display apparatuses may have, as necessary, functional layers such as a smooth layer, a hard coating layer, a gas barrier layer, and a transparent conductive layer; or other optical films being further laminated thereon.

When the polyimide film of the present invention is used as the panel transparent substrate for image display apparatuses, ranges of the glass transition temperature, the linear thermal expansion coefficient, and the total light transmittance of the film are preferably the same as the respective ranges described above. That is, the glass transition temperature of the film is preferably 260° C. or more; the linear thermal expansion coefficient is preferably 30 ppm/K or less; and the total light transmittance is preferably 80% or more.

EXAMPLES

Hereinafter, the present invention will be further described in detail with reference to Examples. However, the technical scope of the present invention is not construed to be limited by these Examples.

1. Synthesis of Starting Oligomer

1) Synthesis of Amic Acid Oligomer (Oligomer Represented by Formula (2A))

Synthesis Example 1

1,4-Diaminocyclohexane (CHDA (trans ratio>99%), 22.6 g, 0.198 mol) and N-methyl-2-pyrrolidone (NMP, 371 g) as an organic solvent were charged into a 500 mL five-necked separable flask equipped with a thermometer, a stirrer and a nitrogen inlet tube, to thereby dissolve CHDA, followed by stirring. 3,3',4,4'-Biphenyltetracarboxylic dianhydride (BPDA, 58.8 g, 0.200 mol) in a powdery form was added to this stirred mixture, and the resultant solution was allowed to react while keeping the separable flask in an oil bath kept at 90° C. for 1 hour. The solution was initially heterogeneous, but in accordance with the progress of the reaction, the solution changed to an almost colorless transparent solution, thereby forming a viscous amic acid oligomer solution.

Synthesis Example 2

An amic acid oligomer was synthesized in substantially the same manner as in Synthesis Example 1 except that the charged amounts of CHDA and BPDA were changed to: CHDA/BPDA (weight: 22.8 g/57.7 g, molar ratio: 1.00/0.98), and that the charged amount of NMP was changed to 36.7 g.

Synthesis Example 3

An amic acid oligomer was synthesized in substantially the same manner as in Synthesis Example 1 except that the charged amounts of CHDA and BPDA were changed to: CHDA/BPDA (weight: 22.8 g/57.1 g, molar ratio: 1.00/0.97), and that the charged amount of NMP was changed to 36.4 g.

Synthesis Example 4

An amic acid oligomer was synthesized in substantially the same manner as in Synthesis Example 1 except that the charged amounts of CHDA and BPDA were changed to: CHDA/BPDA (weight: 22.8 g/54.1 g, molar ratio: 1.00/0.92), and that the charged amount of NMP was changed to 35.1 g.

2) Synthesis of Imide Oligomer (Oligomer Represented by Formula (2B))

Synthesis Example 5

Norbornanediamine (NBDA, 11.9 g, 0.077 mol) and 1,3-dimethyl-2-imidazolidinone (DMI, 12.4 g) as an organic solvent were charged into a 300 mL five-necked separable flask equipped with a thermometer, a stirrer and a nitrogen inlet tube, to thereby dissolve NBDA, followed by stirring. 3,3',4,4'-Biphenyltetracarboxylic dianhydride (BPDA, 29.42 g, 0.100 mol) in a powdery form was added to this stirred mixture, and the resultant solution was allowed to react while keeping the separable flask in an oil bath kept at 120° C. for 5 minutes. The solution was initially heterogeneous, but in accordance with the progress of the reaction, the solution gradually changed to a pale yellow homogeneous solution. After attaching a cooling tube and a Dean-Stark trap to the separable flask, xylene (25.0 g) was added to the solution, and dehydration thermal imidization was carried out at 180° C. for 4 hours while stirring. Subsequently, the xylene was distilled off from the reaction mixture, thereby obtaining an imide oligomer solution.

Synthesis Example 6

An imide oligomer solution was obtained in substantially the same manner as in Synthesis Example 5 except that the charged amounts of NBDA and BPDA were changed to: NBDA/BPDA (weight: 11.3 g/29.4 g, molar ratio: 0.73/1.00), and that the charged amount of DMI was changed to 12.2 g.

Synthesis Example 7

An imide oligomer solution was obtained in substantially the same manner as in Synthesis Example 5 except that the charged amounts of NBDA and BPDA were changed to: NBDA/BPDA (weight: 11.1 g/29.4 g, molar ratio: 0.72/1.00), and that the charged amount of DMI was changed to 12.2 g.

Synthesis Example 8

An imide oligomer solution was obtained in substantially the same manner as in Synthesis Example 5 except that the charged amounts of NBDA and BPDA were changed to: NBDA/BPDA (weight: 9.56 g/29.4 g, molar ratio: 0.62/1.00), and that the charged amount of DMI was changed to 11.7 g.

The intrinsic logarithmic viscosity of the amic acid oligomer solutions obtained in Synthesis Examples 1 to 4 and the imide oligomer solutions obtained in Synthesis Examples 5 to 8 was measured by the following methods.

(Measurement of Intrinsic Logarithmic Viscosity)

Each of the obtained amic acid oligomer solutions and imide oligomer solutions was dissolved in N-methyl-2-pyrrolidone (NMP) at a solid content concentration of 0.5 g/dL to obtain a solution, and the intrinsic logarithmic viscosity (g/dL) of the obtained solution was measured at 35° C. using an Ubbelohde viscometer.

These measurement results are shown in Table 1. With respect to the amic acid oligomer obtained in Synthesis Example 4, the number of CHDA-derived amino groups at oligomer terminals was larger than those of the amic acid oligomers obtained in Synthesis Examples 1 to 3 and, therefore, the amic acid oligomer obtained in Synthesis Example 4 had lower solubility to the additional NMP, making it impossible to measure the intrinsic logarithmic viscosity thereof.

TABLE 1

|  | Amic Acid Oligomer (2A) | | Imide Oligomer (2B) | | Intrinsic Logarithmic Viscosity | |
| --- | --- | --- | --- | --- | --- | --- |
|  | CHDA | BPDA | NBDA | BPDA | (dL/g) | Remarks |
| Synthesis Ex.1 | 0.99 | 1.00 | — | — | 1.66 |  |
| Synthesis Ex.2 | 1.00 | 0.98 | — | — | 0.93 |  |

TABLE 1-continued

| | Amic Acid Oligomer (2A) | | Imide Oligomer (2B) | | Intrinsic Logarithmic Viscosity | |
|---|---|---|---|---|---|---|
| | CHDA | BPDA | NBDA | BPDA | (dL/g) | Remarks |
| Synthesis Ex.3 | 1.00 | 0.97 | — | — | 0.77 | |
| Synthesis Ex.4 | 1.00 | 0.92 | — | — | N/A | Poor Solubility |
| Synthesis Ex.5 | — | — | 0.77 | 1.00 | 0.12 | |
| Synthesis Ex.6 | — | — | 0.73 | 1.00 | 0.10 | |
| Synthesis Ex.7 | — | — | 0.72 | 1.00 | 0.09 | |
| Synthesis Ex.8 | — | — | 0.62 | 1.00 | 0.05 | |

2. Synthesis and Evaluation of Block Polyamic Acid Imide and Block Polyimide

Example 1

1) Synthesis and Evaluation of Block Polyamic Acid Imide
Synthesis of Block Polyamic Acid Imide After mixing the amic acid oligomer solution (concentration 18 wt %, 200 g) obtained in Synthesis Example 2 with the imide oligomer solution (concentration 25 wt %, 3.02 g) obtained in Synthesis Example 5, the resultant mixture was further stirred for 10 minutes using a viscosity material mixer and a defoamer (or a mixing/defoaming apparatus) (Japan Unix Co., Ltd., product name: UM-118) to thereby react the oligomers and obtain a block polyamic acid imide varnish. The ratio between the average values of m and n of the obtained block polyamic acid imide was: average of m:average of n=9.8:0.2.

(E-Type Viscosity)

The concentration of the obtained block polyamic acid imide varnish was adjusted to 16 wt %, and its E-type viscosity at 25° C. was measured using an E-type viscometer (Tokyo Keiki Inc., TVE-22).

Production of Dry Film

The obtained block polyamic acid imide varnish was dropped on a slide glass, and was subjected to spin coating using a spin coater (Able Japan Co., Ltd.). The spin coating was carried out, with rotational speed×time being set at 1,500 rpm×15 sec./1,600 rpm×5 sec. The resultant slide glass having a coating film thereon was placed in an oven at 80° C. and dried (prebaked) for a predetermined time of 15 minutes under a nitrogen stream. The film thickness of the prebaked coating film (dry film) was 17 μm.

(Residual Solvent Content)

The residual solvent content of the dry film obtained by peeling off the film from the slide glass was measured by the following method. Specifically, an electric furnace type pyrolyzer (PYR-2A manufactured by Shimadzu Corporation (pyrolysis temperature: 320° C.)) and a gas chromatography mass spectrometer (GC-8A (column Uniport HP 80/100 KG-02) manufactured by Shimadzu Corporation) were connected together. The dry film was charged into the electric furnace type pyrolyzer and immediately heated at 320° C. to generate volatile components, followed by an analysis of the volatile components with the gas chromatography mass spectrometer. The injector temperature and the detector temperature of the gas chromatography mass spectrometer were set at 200° C., and the column temperature was set at 170° C. An area of the relevant peak in the obtained GC chart was calculated, and the calculated peak area was collated with a calibration curve of the solvent prepared in advance to determine the solvent content of the dry film.

(Solubility)

The slide glass having the dry film thereon was immersed in 2.38% aqueous tetramethylammonium hydroxide (TMAH) solution with a concentration of adjusted to 20° C., while vibrating the slide glass, and the time necessary for the dry film on the slide glass to be dissolved and vanished was measured. The vibration condition was set to 1 Hz using a vibration motor. A quotient of the initial thickness of the dry film divided by the time taken by the dry film to be vanished was set as the "dissolution rate (unit: μm/min.)." The measurement was repeated three times and the average thereof was used as the dissolution rate (unit: μm/min.).

2) Synthesis and Evaluation of Block Polyimide

The obtained block polyamic acid imide varnish was flow-cast on a glass substrate with a doctor blade. The glass substrate was placed in an oven and the temperature was raised from 50° C. to 270° C. over 2 hours in a nitrogen stream, and then kept at 270° C. for 2 hours to imidize the film of the flow-casted varnish. The resultant flow-cast film was peeled off from the glass substrate to obtain a polyimide film.

(Glass Transition Temperature Tg)

A test sample of the obtained polyimide film was subjected to TMA measurement using a measuring apparatus TMA-50 (manufactured by Shimadzu Corporation) under the following conditions: a temperature range of 25° C. to 350° C., a temperature-raising rate of 5° C./min., a load of 14 g/mm$^2$, and a tensile mode. The glass transition temperature (Tg) was determined from an inflection point of the obtained temperature-test sample elongation curve.

(Coefficient of Linear Thermal Expansion: CTE)

The linear thermal expansion coefficient was determined from a slope of the temperature-test sample elongation curve within the interval of from 100° C. to 200° C. obtained by the TMA measurement described above.

(Total Light Transmittance)

The total light transmittance of the obtained polyimide film was measured with the D65 light source in accordance with JIS K 7105 using a haze meter NDH 2000 manufactured by Nippon Denshoku Industries Co., Ltd.

Examples 2 to 4

Block polyamic acid imide varnishes were obtained in substantially the same manner as in Example 1 except that the amic acid oligomer solution (concentration 18 wt %, 200 g) obtained in Synthesis Example 2 was reacted with the imide oligomer solution (concentration 25 wt %, 7.34 g) obtained in Synthesis Example 8 so that the ratio between the average values of m and n of the resultant block polyamic acid imide became average of m:average of n=9.5:0.5.

The E-type viscosity of the obtained varnish, the solubility of the dry film, and the physical properties (glass transition temperature Tg, coefficient of linear thermal expansion (CTE), total light transmittance) of the polyimide film were measured in the same manner as Example 1. It is noted that the prebaking conditions for the measurement of the solubility were set as shown in Table 2.

Example 5

A block polyamic acid imide varnish was obtained in substantially the same manner as in Example 1 except that the amic acid oligomer solution (concentration 18 wt %, 160 g) obtained in Synthesis Example 4 was reacted with the imide oligomer solution (concentration 25 wt %, 6.39 g) obtained in Synthesis Example 7 so that the ratio between the average values of m and n of the resultant block polyamic acid imide became average of m:average of n=9.5: 0.5.

The E-type viscosity of the obtained varnish, the solubility of the dry film, and the physical properties of the polyimide film were measured in the same manner as Example 1. It is noted that the prebaking conditions for the measurement of the solubility were set as shown in Table 2.

Example 6

A block polyamic acid imide varnish was obtained in substantially the same manner as in Example 1 except that the amic acid oligomer solution (concentration 18 wt %, 155 g) obtained in Synthesis Example 4 was reacted with the imide oligomer solution (concentration 25 wt %, 11.6 g) obtained in Synthesis Example 7 so that the ratio between the average values of m and n of the resultant block polyamic acid imide became average of m:average of n=9.1: 0.9.

The E-type viscosity of the obtained varnish, the solubility of the dry film, and the physical properties of the polyimide film were measured in the same manner as Example 1. It is noted that the prebaking conditions for the measurement of the solubility were set as shown in Table 2.

Comparative Examples 1 to 2

Block polyamic acid imide varnishes were obtained in substantially the same manner as in Example 1 except that the amic acid oligomer solution (concentration 18 wt %, 200 g) obtained in Synthesis Example 3 was reacted with the imide oligomer solution (concentration 25 wt %, 16.3 g) obtained in Synthesis Example 6 so that the ratio between the average values of m and n of the resultant block polyamic acid imide became average of m:average of n=9.0: 1.0.

The E-type viscosity of the obtained varnishes, the solubility of the dry film, and the physical properties of the polyimide film were measured in the same manner as Example 1. It is noted that the prebaking conditions for the measurement of the solubility were set as shown in Table 2. During the measurement of the solubility, the dry film came off from the slide glass and no dissolving behavior was observed.

Comparative Example 3

A block polyamic acid imide varnish was obtained in substantially the same manner as in Example 1 except that the amic acid oligomer solution (concentration 18 wt %, 200 g) obtained in Synthesis Example 4 was reacted with the imide oligomer solution (concentration 25 wt %, 37.9 g) obtained in Synthesis Example 7 so that the ratio between the average values of m and n of the resultant block polyamic acid imide became average of m:average of n=8.0: 2.0.

The E-type viscosity of the obtained varnish, the solubility of the dry film, and the physical properties of the polyimide film were measured in the same manner as Example 1. It is noted that the prebaking conditions for the measurement of the solubility were set as shown in Table 2. During the measurement of the solubility, the dry film came off from the slide glass and no dissolving behavior was observed.

Comparative Example 4

A block polyamic acid imide varnish was obtained in substantially the same manner as in Example 1 except that the amic acid oligomer solution (concentration 18 wt %, 170 g) obtained in Synthesis Example 4 was reacted with the imide oligomer solution (concentration 25 wt %, 36.4 g) obtained in Synthesis Example 7 so that the ratio between the average values of m and n of the resultant block polyamic acid imide became average of m:average of n=7.8: 2.2.

The E-type viscosity of the obtained varnish, the solubility of the dry film, and the physical properties of the polyimide film were measured in the same manner as Example 1. It is noted that the prebaking conditions for the measurement of the solubility were set as shown in Table 2. During the measurement of the solubility, the dry film came off from the slide glass and no dissolving behavior was observed.

Comparative Example 5

Use was made of a reactor which is the same as that used in Synthesis Example 1. 1,4-Diaminocyclohexane (CHDA, 19.0 g, 0.166 mol), norbornanediamine (NBDA, 5.24 g, 0.0340 mol), and N-methyl-2-pyrrolidone (NMP, 378 g) as an organic solvent were charged into the reactor and dissolved, followed by stirring. 3,3',4,4'-Biphenyltetracarboxylic dianhydride (BPDA, 58.8 g, 0.200 mol) in a powdery form was added to this stirred mixture, and the resultant solution was allowed to react while keeping the separable flask in an oil bath kept at 90° C. for 1 hour. The solution was initially heterogeneous, but in accordance with the progress of the reaction, the solution changed to an almost colorless transparent solution, thereby forming a varnish which is a viscous polyamic acid solution.

The E-type viscosity of the obtained varnish, the solubility of the dry film, and the physical properties of the polyimide film were measured in the same manner as in Example 1. It is noted that the prebaking conditions for the measurement of the solubility were set as shown in Table 2. The dissolution rate of the dry film was 70.2 µm/min., and it dissolved excessively in a 2.38% aqueous TMAH solution.

Comparative Example 6

The amic acid oligomer solution was prepared in the same manner as in Synthesis Example 1. Then, the E-type viscosity of this solution, the solubility of the dry film, and the physical properties of the polyimide film were measured in the same manner as in Example 1. It is noted that the prebaking conditions for the measurement of the solubility were set as shown in Table 2. The dissolution rate of the dry film was 66.0 µm/min., and it dissolved excessively in a 2.38% aqueous TMAH solution.

Comparative Example 7

The amic acid oligomer solution was prepared in the same manner as in Synthesis Example 4. Then, the E-type viscosity of this solution, and the solubility of the dry film were measured in the same manner as in Example 1. It is noted that the prebaking conditions for the measurement of the solubility were set as shown in Table 2. The dissolution rate of the dry film was 88.8 μm/min., and it dissolved excessively in a 2.38% aqueous TMAH solution. In addition, production of a polyimide film was attempted in the same manner as in Example 1, the polyimide was brittle and could not maintain a film form.

Comparative Example 8

Use was made of a reactor which is the same as that used in Synthesis Example 1. Norbornanediamine (NBDA, 30.9 g, 0.200 mol), and N,N-dimethylacetamide (DMAc, 209 g) as an organic solvent were charged into the reactor and dissolved, followed by stirring. 3,3',4,4'-Biphenyltetracarboxylic dianhydride (BPDA, 58.8 g, 0.200 mol) in a powdery form was added to this stirred mixture, and the resultant solution was allowed to react while keeping the separable flask in an oil bath kept at 90° C. for 1 hour. The solution was initially heterogeneous, but in accordance with the progress of the reaction, the solution changed to a transparent solution, thereby forming a viscous polyamic acid solution.

The E-type viscosity of the obtained polyamic acid solution, the solubility of the dry film, and the physical properties of the polyimide film were measured in the same manner as in Example 1. It is noted that the prebaking conditions for the measurement of the solubility were set as shown in Table 2. The dissolution rate of the dry film was 73.2 μm/min., and it dissolved excessively in a 2.38% aqueous TMAH solution.

Comparative Example 9

Use was made of a reactor which is the same as that used in Synthesis Example 1. 1,4-Bis(aminomethylcyclohexane) (14BAC, 14.25 g, 0.100 mol), and N,N-dimethylacetamide (DMAc, 229 g) as an organic solvent were charged into the reactor and dissolved, followed by stirring. 3,3',4,4'-Biphenyltetracarboxylic dianhydride (BPDA, 29.4 g, 0.100 mol) in a powdery form was added to this stirred mixture, and the resultant solution was allowed to react while keeping the separable flask in an oil bath kept at 90° C. for 1 hour. The solution was initially heterogeneous, but in accordance with the progress of the reaction, the solution changed to a transparent solution, thereby forming a viscous polyamic acid solution.

The E-type viscosity of the obtained polyamic acid solution, the solubility of the dry film, and the physical properties of the polyimide film were measured in the same manner as in Example 1. It is noted that the prebaking conditions for the measurement of the solubility were set as shown in Table 2. The dissolution rate of the dry film was 79.8 μm/min., and it dissolved excessively in a 2.38% aqueous TMAH solution.

Comparative Example 10

Use was made of a reactor which is the same as that used in Synthesis Example 1. 2,2'-Bis(trifluoromethyl)-4,4'-diaminobiphenyl (TFMB, 25.6 g, 0.080 mol), and N-methyl-2-pyrrolidone (NMP, 279 g) as an organic solvent were charged into the reactor and dissolved, followed by stirring. 3,3',4,4'-Biphenyltetracarboxylic dianhydride (BPDA, 23.5 g, 0.0800 mol) in a powdery form was added to this stirred mixture, and the resulting solution was allowed to react while keeping the separable flask in an oil bath kept at 90° C. for 1 hour. The solution was initially heterogeneous, but in accordance with the progress of the reaction, the solution changed to a transparent solution, thereby forming a viscous polyamic acid solution.

The E-type viscosity of the obtained polyamic acid solution, the solubility of the dry film, and the physical properties of the polyimide film were measured in the same manner as in Example 1. It is noted that the prebaking conditions for the measurement of the solubility were set as shown in Table 2. During the measurement of the solubility, the dry film came off from the slide glass and no dissolving behavior was observed.

The synthesis conditions for the block polyamic acid imides and polyimides of Examples 1 to 6 and Comparative Examples 1 to 10 are shown in Table 2; and the evaluation results of the varnishes, dry films, and polyimide films are shown in Table 3.

TABLE 2

| | Amic Acid Oligomer (2A) | Imide Oligomer (2B) | Composition Ratio (2A) | Composition Ratio (2B) | Diamine (2A) | Diamine (2B) | Diamine (2B) | Acid Anhydride (2A), (2B) |
|---|---|---|---|---|---|---|---|---|
| | Synthesis Ex. | Synthesis Ex. | Average Value of m | Average Value of n | CHDA | NBDA | Other Diamines | BPDA |
| Ex. 1 | 2 | 5 | 9.8 | 0.2 | 0.98 | 0.02 | | 0.98 |
| Ex. 2 | 2 | 8 | 9.5 | 0.5 | 0.97 | 0.03 | | 1 |
| Ex. 3 | | | | | | | | |
| Ex. 4 | | | | | | | | |
| Ex. 5 | 4 | 7 | 9.5 | 0.5 | 0.96 | 0.04 | | 0.93 |
| Ex. 6 | 4 | 7 | 9.1 | 0.9 | 0.94 | 0.06 | | 0.96 |
| Comp. Ex. 1 | 3 | 6 | 9 | 1 | 0.93 | 0.07 | | 1 |
| Comp. Ex. 2 | | | | | | | | |
| Comp. Ex. 3 | 4 | 7 | 8 | 2 | 0.85 | 0.15 | | 1 |
| Comp. Ex. 4 | 4 | 7 | 7.8 | 2.2 | 0.83 | 0.17 | | 1 |
| Comp. Ex. 5 | — | — | — | — | 0.83 | 0.17 | | 1 |
| Comp. Ex. 6 | 1 | — | 1 | 0 | 1 | 0 | | 1.01 |

TABLE 2-continued

| | Amic Acid Oligomer (2A) Synthesis Ex. | Imide Oligomer (2B) Synthesis Ex. | Composition Ratio (2A) Average Value of m | Composition Ratio (2B) Average Value of n | Diamine (2A) CHDA | Diamine NBDA | Diamine (2B) Other Diamines | Acid Anhydride (2A), (2B) BPDA |
|---|---|---|---|---|---|---|---|---|
| Comp. Ex. 7 | 4 | — | 1 | 0 | 1 | 0 | | 0.92 |
| Comp. Ex. 8 | — | — | — | — | 0 | 0 | NBDA 1 | 1 |
| Comp. Ex. 9 | — | — | — | — | 0 | 0 | 14BAC 1 | 1 |
| Comp. Ex. 10 | — | — | — | — | 0 | 0 | TFMB 1 | 1 |

TABLE 3

| | Polyamic Acid Imide Varnish Concentration (wt %) | Polyamic Acid Imide Varnish E-type Vicosity (mPa·s) | Prebaking Condition Temperature (° C.) | Prebaking Condition Time (min) | Dry Film Film Thickness (μm) | Dry Film Residual Solvent Content (% by mass) | Dry Film Dissolving Behavior | Dissolution Rate (μm/min) | Full Cure Temperature (° C.) | Polyimide Film Tg (° C.) | Polyimide Film CTE (ppm/K) | Polyimide Film Total Light Transmittance (%) |
|---|---|---|---|---|---|---|---|---|---|---|---|---|
| Ex. 1 | 16 | 3400 | 80 | 15 | 17 | 10 | Dissolved | 38.4 | 270 | 305 | 7 | 86 |
| Ex. 2 | 11 | 6600 | 80 | 15 | 13 | 9 | Dissolved | 22.2 | 270 | 296 | 7 | 87 |
| Ex. 3 | | | 80 | 60 | 13 | 8 | Dissolved | 21.6 | 270 | | | |
| Ex. 4 | | | 120 | 15 | 12 | 5 | Dissolved | 20.4 | 270 | | | |
| Ex. 5 | 15 | 4100 | 80 | 15 | 10 | 8 | Dissolved | 19.8 | 270 | 294 | 10 | 88 |
| Ex. 6 | 15 | 5100 | 80 | 15 | 12 | 9 | Dissolved | 16.2 | 270 | 300 | 10 | 89 |
| Comp. Ex. 1 | 12 | 5800 | 80 | 15 | 13 | 10 | Came Off | — | 270 | 290 | 8 | 87 |
| Comp. Ex. 2 | | | 80 | 60 | 13 | 8 | Came Off | — | | | | |
| Comp. Ex. 3 | 13 | 2800 | 80 | 15 | 41 | 12 | Came Off | — | 270 | 280 | 21 | 85 |
| Comp. Ex. 4 | 11 | 9500 | 80 | 15 | 15 | 9 | Came Off | — | 270 | 299 | 10 | 87 |
| Comp. Ex. 5 | 15 | 8900 | 80 | 15 | 37 | 15 | Dissolved Excessively | 70.2 | 270 | 297 | 16 | 87 |
| Comp. Ex. 6 | 12 | 8900 | 80 | 15 | 21 | 11 | Dissolved Excessively | 66 | 270 | 300 | 7 | 87 |
| Comp. Ex. 7 | 16 | 4200 | 80 | 15 | 14 | 9 | Dissolved Excessively | 88.8 | 270 | — | — | — |
| Comp. Ex. 8 | 30 | 11000 | 80 | 15 | 48 | 8 | Dissolved Excessively | 73.2 | 270 | 250 | 43 | 86 |
| Comp. Ex. 9 | 16 | 9000 | 80 | 15 | 14 | 7 | Dissolved Excessively | 79.8 | 270 | 264 | 43 | 89 |
| Comp. Ex. 10 | 15 | 3400 | 80 | 15 | 10 | 10 | Came Off | — | 270 | 290 | 9 | 87 |

All of the dry films obtained in Examples 1 to 6 exhibited moderate solubility in the aqueous alkaline solution. In contrast, all of the dry films obtained in Comparative Examples 1 to 4 and 10 came off from the slide glass showing almost no solubility in the aqueous alkaline solution; and that the dry films of Comparative Examples 5 to 9 dissolved excessively in the aqueous alkaline solution.

Specifically, from the comparison between Comparative Examples 4 and 5, it is apparent that even when the ratio between the average values of m and n is the same, the block copolymer has lower dissolution rate than the random copolymer. In addition, as apparent from Comparative Examples 5 to 9, the dry film composed only of amic acid oligomers (having no imide oligomer skeleton) has too high solubility, and thus cannot be adjusted in terms of the dissolution rate. Further, the dry film composed only of amic acid oligomers produced in Comparative Example 10 has low hydrophilicity due to its structure derived from a fluorine monomer, and thus has extremely low solubility in the aqueous alkaline solution.

Furthermore, from the comparisons among Examples 2 to 4, the lower residual solvent content of the dry film leads to lower dissolution rate. From these results, it is apparent that the residual solvent content of the dry film can be also used to adjust the dissolution rate.

This application is entitled to and claims the benefit of Japanese Patent Application No. 2013-092388, filed on Apr. 25, 2013, the disclosures of which including the specification, drawings and abstract are incorporated herein by reference in its entirety.

INDUSTRIAL APPLICABILITY

According to the present invention, it is possible to provide a block polyamic acid imide having moderate solubility in an aqueous alkaline solution, and a block polyimide obtained by using the same which has high transparency and low coefficient of linear thermal expansion (low CTE).

The invention claimed is:

1. A laminate for a circuit substrate, comprising a substrate and a layer to be patterned, the layer contains a block polyamic acid imide which comprises a block composed of a repeating structural unit represented by formula (2A) and a block composed of a repeating structural unit represented by formula (2B):

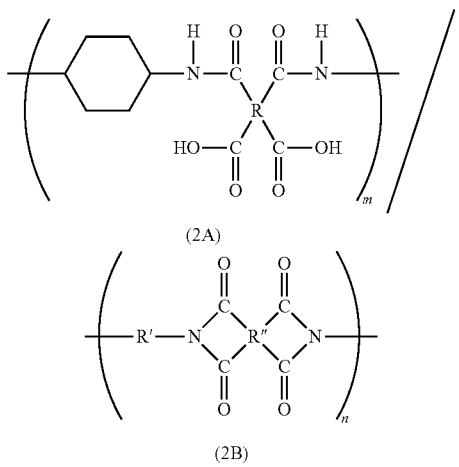

wherein:

m represents the number of the repeating structural units represented by formula (2A), and n represents the number of the repeating structural units represented by formula (2B), an average value of m is defined as a quotient of the total number of the repeating structural units represented by formula (2A) contained in the block polyamic acid imide divided by the number of blocks composed of the repeating structural units represented by formula (2A), an average value of n is defined as a quotient of the total number of the repeating structural units represented by formula (2B) contained in the block polyamic acid imide divided by the number of the blocks composed of the repeating structural units represented by formula (2B), and ratio between the average values of m and n (average of m:average of n) is (less than 10:more than 0) to (more than 9:less than 1) but exclusive of a range of from (9.5:0.5) to (more than 9:less than 1), R and R″ each independently represent a $C_4$-$C_{27}$ tetravalent group which is a monocyclic aliphatic group, condensed polycyclic aliphatic group, monocyclic aromatic group or condensed polycyclic aromatic group, or a non-condensed polycyclic aliphatic group in which cyclic aliphatic groups are mutually linked to each other either directly or via a crosslinking member, or a non-condensed polycyclic aromatic group in which aromatic groups are mutually linked to each other either directly or via a crosslinking member, and R′ is a $C_4$-$C_{51}$ divalent group which is a monocyclic aliphatic group (but exclusive of a 1,4-cyclohexylene group), condensed polycyclic aliphatic group, or non-condensed polycyclic aliphatic group in which cyclic aliphatic groups are mutually linked to each other either directly or via a crosslinking member, and the block polyamic acid imide is obtained by reacting an amic acid oligomer composed of the repeating structural units represented by formula (2A) with an imide oligomer composed of the repeating structural units represented by formula (2B), the amic acid oligomer having a logarithmic viscosity of 0.3 to 3.0 dl/g at concentration of 0.5 g/dl in N-methyl-2-pyrrolidone at 35° C., the block polyamic acid imide in a form of a dry film having a residual solvent content of 10% by mass and a thickness of 15 μm exhibits a dissolution rate at 20° C. in the range of from more than 22.2 μm/min to less than or equal to 60 μm/min, the dissolution rate being measured by immersing the dry film in 2.38% by mass aqueous solution of tetramethylammonium hydroxide, and the layer has a thickness of 5 to 100 μm.

2. The laminate according to claim 1, wherein the block polyamic acid imide has the average values of m and n of 2 to 1,000, respectively.

3. The laminate according to claim 1, wherein a polyimide composed of the repeating structural units represented by formula (2B) is soluble in an aprotic polar solvent.

4. The laminate according to claim 1, wherein the block polyamic acid imide has a logarithmic viscosity of 0.1 to 3.0 dl/g, the logarithmic viscosity being measured in N-methyl-2-pyrrolidone solvent or N,N-dimethylacetamide solvent at a concentration of 0.5 g/dl and at 35° C.

5. The laminate according to claim 1, wherein a dry film of the block polyamic acid imide having a residual solvent content of 10% by mass and a thickness of 15 μm exhibits a dissolution rate in the range of from 38.4 to 60 μm/min. at 20° C., the dissolution rate being measured by immersing the dry film in a 2.38% by mass aqueous solution of tetramethylammonium hydroxide.

* * * * *